(12) United States Patent
Kobayashi

(10) Patent No.: US 6,317,003 B1
(45) Date of Patent: Nov. 13, 2001

(54) RADIO-FREQUENCY AMPLIFIER, AND RADIO COMMUNICATION SYSTEM USING IT

(75) Inventor: Kazuhiko Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/525,423

(22) Filed: Mar. 14, 2000

(30) Foreign Application Priority Data

Mar. 15, 1999 (JP) .................................................. 11-68669

(51) Int. Cl.⁷ .................................................. H01L 1/203
(52) U.S. Cl. ...................... 330/306; 330/207 P; 333/204; 333/995; 505/210
(58) Field of Search ..................................... 333/202, 203, 333/204, 219, 995; 505/210, 700, 701; 330/207 P, 298

(56) References Cited

U.S. PATENT DOCUMENTS 5,496,795 * 3/1996 Das ........................................ 505/210
6,094,588 * 7/2000 Adam .................................... 505/210

FOREIGN PATENT DOCUMENTS 7-46070  2/1995 (JP) .
9-261082 10/1997 (JP) .

* cited by examiner

*Primary Examiner*—Tuan T. Lam
(74) *Attorney, Agent, or Firm*—Armstrong, Westerman, Hattori, McLeland & Naughton, LLP

(57) ABSTRACT

A radio-frequency amplifier including a power amplifier for amplifying the power of a radio-frequency signal in a desired frequency band; and a band rejection filter for receiving the radio-frequency signal from the power amplifier and for restricting the spread of the signal spectrum into frequency bands which lie adjacent to the desired band of the radio-frequency signal. The band rejection filter includes a first line, which is formed of a non-superconducting material and which receives a radio-frequency signal, and a second line, used for resonance, which is formed of a superconducting material and which resonates with adjacent frequencies. Because the thus arranged superconducting filter is employed, a radio-frequency signal is transmitted at a high power along the first line, while a radio-frequency signal in an adjacent frequency band, for which the power is comparatively low and is to be removed, is suppressed along the second line, which is formed of a superconducting material. Therefore, the superconducting band rejection filter can retain a sharp skirt characteristic for a signal having a high frequency and high power, and can also maintain its superconductivity.

10 Claims, 10 Drawing Sheets

Input/Output Characteristc of Superconducting Transmission Path

Spectrum Suppression Characteristic of Superconducting BPF

Output Characteristic for W-CDMA signal (1)

Output Characteristic for W-CDMA signal (2)

Spectrum of Radio-Frequency Amplifier

RADIO-FREQUENCY AMPLIFIER, AND RADIO COMMUNICATION SYSTEM USING IT

BACKGROUND OF THE INVENTION

1. Field of the Invention

The present invention relates to a radio-frequency amplifier which is operated at high efficiency, especially a radio-frequency amplifier which is operated in a high frequency band and for which the linear characteristic is maintained up to a high power area, and a radio communication system employing such a radio-frequency amplifier.

2. Description of the Related Art

In a radio communication system, such as a mobile communication system employing the wide-band CDMA (Code Division Multiple Access) system or the TDMA (Time Division Multiple Access) system, communication must be performed in an assigned frequency band (channel). In this radio communication system, a desired modulation for a transmission signal is acquired by using a transmission circuit, the obtained signal, which occupies a narrow band, is amplified by a radio-frequency (RF) amplifier, and the resultant signal is transmitted via an antenna. Therefore, for a radio communication system, a radio-frequency amplifier is desired for which the linear characteristic can be maintained up into a high power area, and a broad dynamic range can be obtained.

FIGS. 1A to 1C are diagrams illustrating a communication system employing a conventional radio-frequency amplifier. As is shown in FIG. 1A, a radio-frequency signal RF1 is generated by a transmission circuit in a wide-band CDMA system, and is amplified by a power amplifier PA. The spread of the spectrum of an output signal RF2 is restricted or removed by a band-pass filter 2, and a radio-frequency signal RF3 occupying a narrow band is transmitted via an antenna 3. Normally, the amplifier PA has a satisfactory linear characteristic in a low input power area, while in a high input power area, the output power is saturated and the characteristic is non-linear. Therefore, if the dynamic range is to be employed in order to efficiently operate the amplifier PA, the spectrum of the output signal RF2 produced by the amplifier PA is spread so that it exceeds the limits of a desired band (channel) and interferes with the transmission of communication signals in adjacent channels.

Specifically, as is shown in FIG. 1B, the transmission signal RF1 generated by the transmission circuit 1 is fitted within a narrow band (channel), while the output signal RF2 of the amplifier PA, due to the non-linear characteristic of the amplifier PA, is spread and extends outward into adjacent frequency bands. Thus, conventionally, a band-pass filter 2 is inserted, at the output side of the amplifier PA, which permits the passage only of the part of a signal that fits within a desired band. With this band-pass filter 2, portions of a spectrum that extend outward into adjacent frequency bands is suppressed, and as is shown in FIG. 1C, the power exerted by the signal RF3 in adjacent bands is reduced.

However, the suppression characteristic of a band-pass filter 2, which is normally made of metal, is not ideal, and does not have a sharp skirt characteristic with a desired band as the center, so that the removal of the spread of the spectrum of the signal RF3 is not satisfactory. Therefore, in order to adequately eliminate the spread, multiple stage band-pass filters are provided. This arrangement, however, is not preferable because there is an increased power loss in the desired band. Of course, if the power input to the amplifier PA is backed off (lowered) from the level at which the amplifier becomes saturated, the spread of the spectrum can be removed; but in this case, the efficiency of the radio-frequency amplifier is deteriorated.

Therefore, as the band-pass filter 2, the use has been proposed of a superconducting band-pass filter wherein a superconducting material having a sharp skirt characteristic and a low power loss, even if multiple filters are connected together, is employed for a strip line. As one such proposal, disclosed in Japanese Unexamined Patent Publication No. Hei 9-261082 is the employment of a superconducting band-pass filter that provides a sharp cutoff characteristic.

However, an efficient operation and a linear characteristic can not be attained merely by inserting a superconducting band-pass filter into a radio-frequency amplifier. That is, in order for a power amplifier PA to operate efficiently, the input power that is used must originate in the high power range, without being backed off from the saturation level, and as large a dynamic range as possible must be employed. Therefore, the power of the radio-frequency signal RF2 which is transmitted to the superconducting band-pass filter 2 must be increased.

As a result, a high power and high frequency signal is provided along the transmission path of the superconducting band-pass filter 2 which, because its main component is a superconducting material, is normally stored in a freezer at a temperature considerably lower than the critical temperature of the superconducting material. Then, when the high power radio-frequency signal RF arrives at the filter, the resistance along the transmission path composed of the superconducting material, is increased and heat is generated, especially within an area of either end of the transmission path where the electromagnetic waves are concentrated. Subsequently, the temperature along the transmission path rises until it exceeds the critical temperature of the superconducting material, and the high conductivity quality of the superconducting material is lost. Furthermore, if the superconducting material which is used for the transmission path is made of a ceramic, not only will the high conductivity be lost, but eventually the material will acquire an insulating characteristic. Therefore, the insertion loss for the supperconunductor band-pass filter is increased for a high power and high frequency signal.

As is described above, according to the conventional method, the power resistance of superconducting film can not prevent the superconducting characteristic of a superconducting band-pass filter from being adversely affected by the power of a signal RF2 output by the power amplifier PA, and can not satisfactorily suppress the spread of the spectrum of the signal RF3 which is to be transmitted.

In addition, if lightning should strike an antenna and a very high power charge should thereby be supplied to the superconducting filter, superconducting film employed therein would be destroyed. And since after the film is destroyed the filter can no longer function as a superconducting filter, it must be replaced. In such a case, because the conductive characteristic of superconducting filters is constantly variable, the radio communication system for which the new filter was provided would have to be adjusted, and radio communication would be interrupted.

SUMMARY OF THE INVENTION

It is, therefore, one objective of the present invention to provide a radio-frequency amplifier which can be operated at high efficiency and for which the linear characteristic is ensured, while taking into account the power resistance of a superconducting film; and to provide a radio communication system which employs the radio-frequency amplifier.

It is another objective of the present invention to provide a radio-frequency amplifier which can be operated at high efficiency and which has a large dynamic range, and for which the spread of a spectrum to adjacent bands (channels) is suppressed; and to provide a radio communication system which employs the radio-frequency amplifier.

It is an additional objective of the present invention to provide a radio-frequency amplifier wherein a superconducting filter can be protected from the effects produced when lightning strikes; and to provide a radio communication system which employs the radio-frequency amplifier.

To achieve the above objectives, a radio-frequency amplifier according to the present invention comprises: a power amplifier for amplifying the power of a radio-frequency signal in a desired frequency band; and a band rejection filter for receiving the radio-frequency signal from the power amplifier and for restricting the spread of the signal spectrum into frequency bands which lie adjacent to the desired band of the radio-frequency signal. The band rejection filter includes a first line, which is formed of a non-superconducting material and which receives a radio-frequency signal, and a second line, used for resonance, which is formed of a superconducting material and which resonates with adjacent frequencies. Since the thus arranged superconducting filter is employed, a radio-frequency signal is transmitted at high power along the first line, which is formed of a non-superconducting material, the conductivity of which is not reduced due to the generation of heat, while a radio-frequency signal in an adjacent frequency band, for which the power is comparatively low and is to be removed, is suppressed along the second line, which is formed of a superconducting material. Therefore, the superconducting band rejection filter can retain a sharp skirt characteristic for a signal having a high frequency and high power, and can also maintain its superconductivity. When the superconducting band rejection filter is inserted at the stage succeeding the power amplifier, a radio-frequency amplifier can be provided which can efficiently amplify power and which has a superior linear characteristic.

To achieve the above objectives, according to the present invention, a radio-frequency amplifier, which amplifies a received radio-frequency signal having a desired frequency band, comprises:

a power amplifier for amplifying the power of the received radio-frequency signal; and a superconducting band rejection filter for receiving a radio-frequency signal from the power amplifier and for suppressing the passing of a signal having frequency bands lying adjacent to the desired frequency band of the radio-frequency signal, the superconducting band rejection filter including a first line, formed of a non-superconducting material, for receiving the radio-frequency signal, and a second line, formed of a superconducting material, for resonating with the signal in the adjacent frequency bands.

Further, according to the present invention, a protection circuit having a line composed of a superconducting material is inserted between the power amplifier and the superconducting band rejection filter.

Damage to the superconducting band rejection filter relative to high power transmission can be prevented by the non-linear characteristic of the superconducting transmission path.

Further, to achieve the above objectives, according to the present invention, a radio-frequency amplifier, which amplifies an input radio-frequency signal having a desired frequency band, comprises:

a power amplifier for amplifying the power of the input radio-frequency signal;

a protection circuit, for receiving a radio-frequency signal provided by the power amplifier, which includes a line formed of a superconducting material through which the radio-frequency signal is passed; and a superconducting band-pass filter for receiving a signal output by the protection circuit and for suppressing the passing of a signal of frequency bands adjacent to the desired frequency band.

DETAILED DESCRIPTION OF THE PREFERRED EMBODIMENTS

Figure 1A:
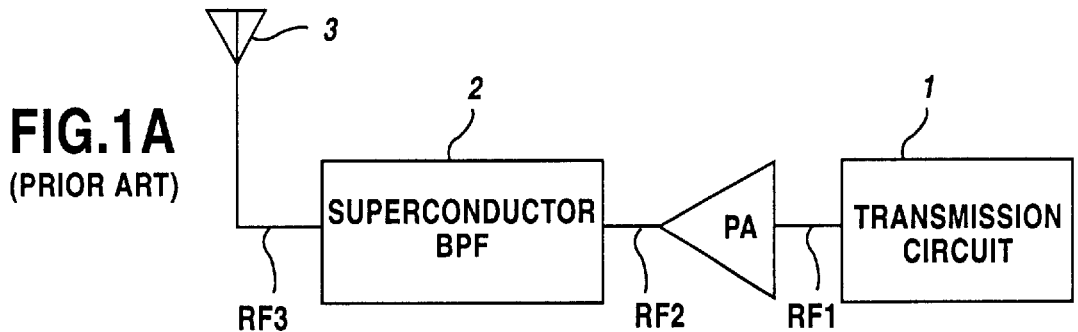
FIGS. 1A to 1C are diagrams showing a communication system employing a conventional radio-frequency amplifier.

The preferred embodiments of the present invention will now be described while referring to the drawings. It should be noted, however, that the present invention is not limited to these embodiments.

Figure 2:
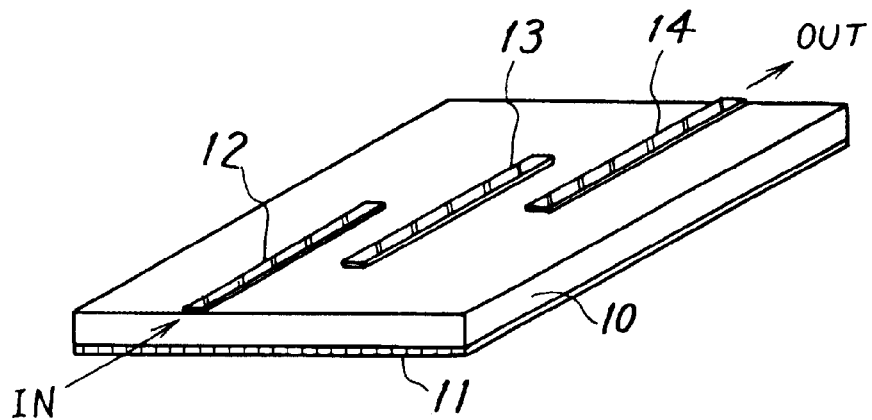
FIG. 2 is a diagram showing the arrangement of a superconducting band-pass filter.
Figure 3:
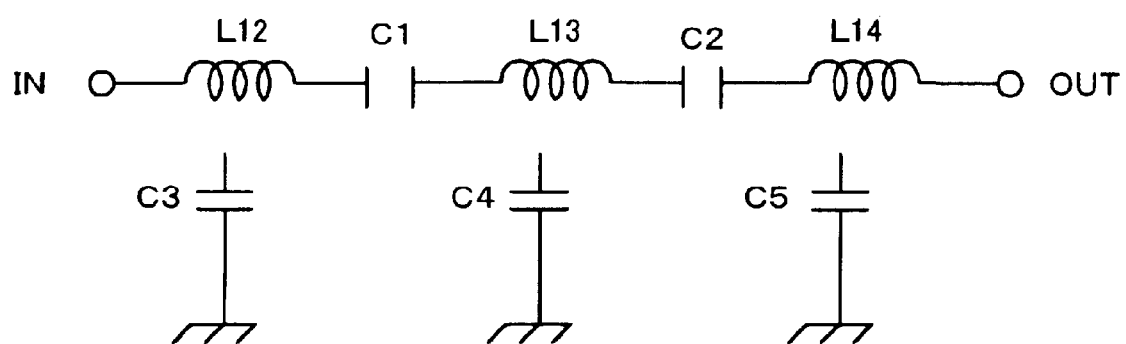
FIG. 3 is a diagram showing an equivalent circuit for the superconducting band-pass filter.

FIG. 2 is a diagram showing an example arrangement for a superconducting band-pass filter. FIG. 3 is a diagram showing an equivalent circuit for the superconducting bandpass filter. In the superconducting band-pass filter, a ground conductive layer 11 is deposited on the reverse face of a dielectric substrate 10, and three micro-strip lines 12, 13 and 14, composed of a superconducting material, are deposited on the obverse face. A radio-frequency signal IN is input to the micro-strip line 12, and a radio-frequency signal OUT which has passed through the filter is output by the micro-strip line 14. Assuming that the wavelength of a signal in a passed band is λ, the micro-strip lines 12 and 13 are arranged opposite each other, separated by a distance of λ/4, for example, and are coupled by a capacitor C1. The micro-strip lines 12, 13 and 14 have inductances L12, L13 and L14, respectively, and capacitors C3, C4 and C5 are located between the respective micro-strip lines and the ground conductive layer 11.

Figure 4:
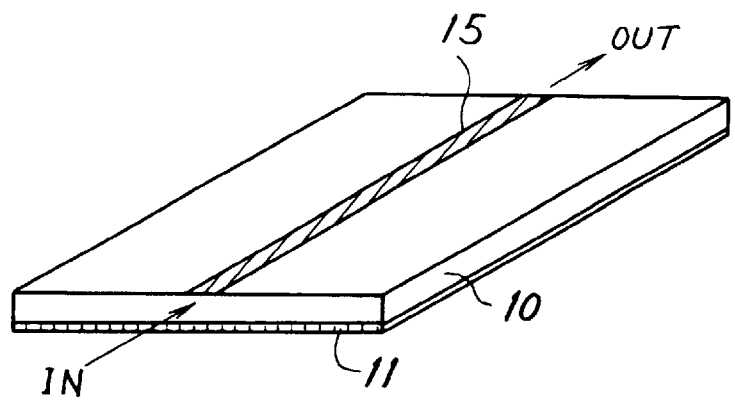
FIG. 4 is a diagram showing the structure of a superconducting transmission path.

FIG. 4 is a diagram showing an example structure for a superconducting transmission path. Similarly to FIG. 2, the ground conductive layer 11 is deposited on the reverse face of the dielectric substrate 10, and a micro-strip line 15, composed of a superconducting ceramic material, is deposited on the obverse face. A signal IN is input at one end of the line 15, and a signal OUT is output at the other end. Since the conductivity of this superconducting transmission path is very high, insertion loss is low.

Figure 5:
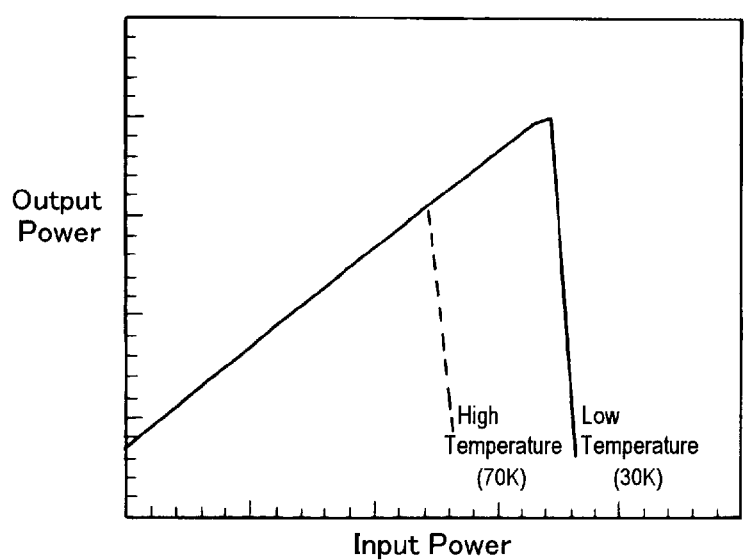
FIG. 5 is a graph showing the input/output characteristic of the superconducting transmission path.

FIG. 5 is a graph showing the input/output characteristic of the superconducting transmission path. The horizontal axis represents the input power and the vertical axis represents the output power. As is shown in FIG. 5, the linear characteristic of the superconducting transmission path is such that as the input power is increased, the output power passed along the path is also increased. However, the output power is reduced in an area wherein the input power is high. Moreover, as the temperature rises in the freezer in which the superconducting transmission path is stored, the output power is lowered, even if the input power is not too high, and the loss is increased. In addition, even if the temperature in the freezer is low, when the input power reaches a certain high level, the output power is lowered and the loss is increased.

The above described input/output characteristic is obtained for the following reasons. If micro-strip lines are formed of a high-temperature superconducting material, such as yttrium ceramics, the resistance across the transmission path is increased for a radio-frequency signal, and heat is generated. Furthermore, when the power is increased, heat is also generated due to the concentration of electromagnetic waves at the line edges. As a result, the temperature of the transmission path exceeds the critical temperature, and the transmission path loses its superconductivity and becomes an insulating member. Therefore, as is shown in FIG. 5, if the temperature of the freezer used to maintain the superconductivity effect is low, e.g., 30 K, a high output power can be obtained relative to a comparatively high input power. But if the temperature in the freezer is high, close to the critical temperature, e.g., 60 K, the loss is increased, even when the input power is comparatively low.

Figure 6:
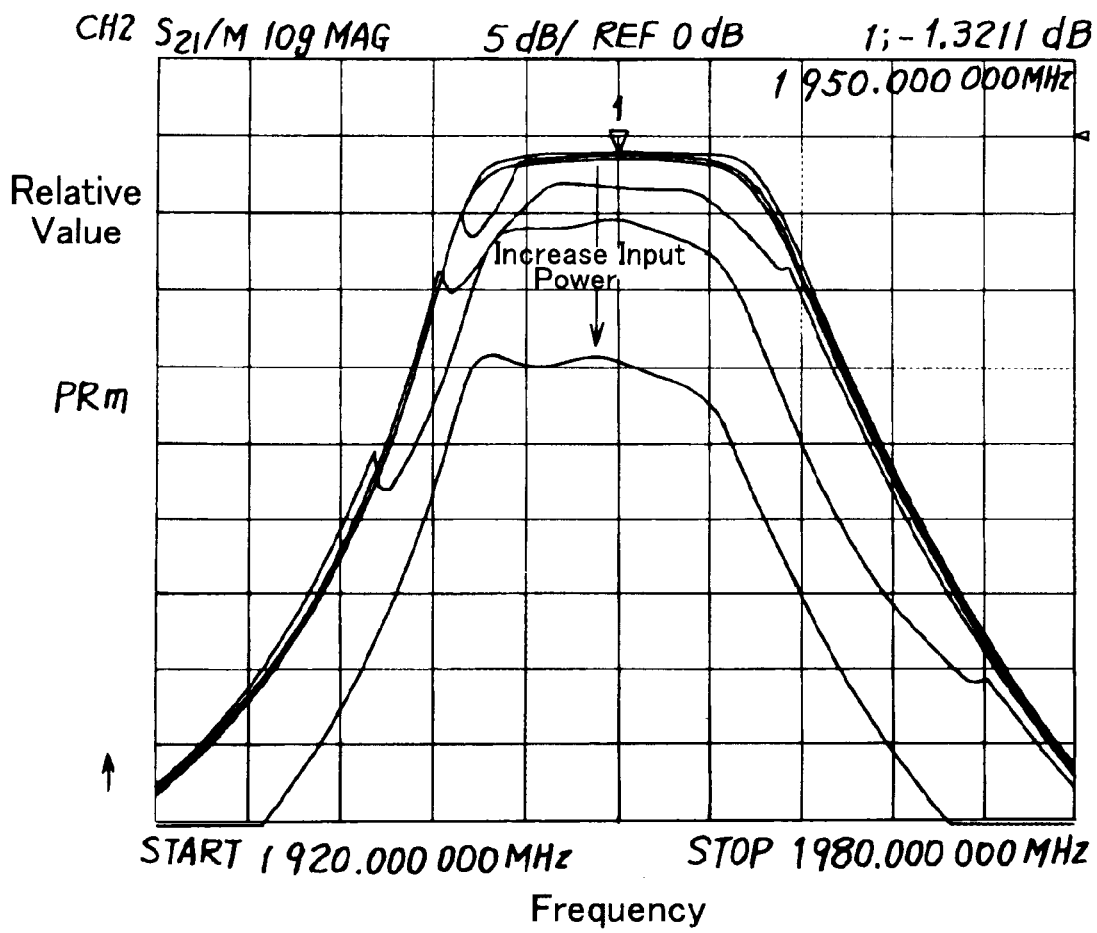
FIG. 6 is a graph showing the spectrum suppression characteristic of the superconducting band-pass filter.

FIG. 6 is a diagram showing the spectrum suppression characteristic of the superconducting band pass filter. The horizontal axis represents the frequencies, here the center frequency is 1950 MHz, while the vertical axis is a relative value. According to the ideal spectrum suppression characteristic, the suppression of a predetermined frequency band around the center frequency is low, while outside of the predetermined frequency band spectrum suppression is the greatest. In FIG. 6, a plurality of characteristics are shown which appear when there is a change in the input power.

As explained while referring to FIG. 5, when the transmission path of the superconducting band-pass filter is formed of a superconducting material, the superconductivity of the transmission path can not be maintained as the input power is increased, and as is shown in FIG. 6, the loss affecting a frequency band which should be passed is increased very much due to the ceramic characteristics. As a result, the insertion loss for the superconducting band-pass filter is larger than that of conventional micro-strip lines, which are formed of a metal, such as gold.

Figure 7:
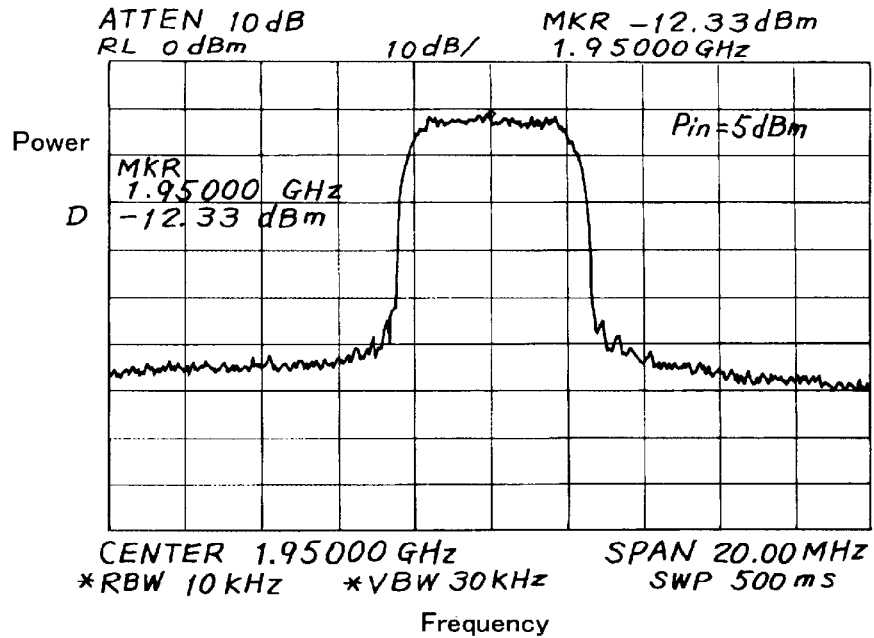
FIG. 7 is a graph showing one output characteristic when a wide-band CDMA signal is transmitted to the superconducting transmission path.

FIG. 7 is a diagram showing one output characteristic when a wide-band CDMA signal is transmitted to the superconducting transmission path in FIG. 4. The horizontal axis represents a frequency, and the vertical axis represents power. In the example in FIG. 7, input power Pin is comparatively low, about 5 dBm. As is shown in FIG. 7, since the superconducting transmission path has an ideal linear characteristic in which the loss in a low power area is small, the power in a desired frequency band is high, and the power in adjacent bands on either side is low.

Figure 8:
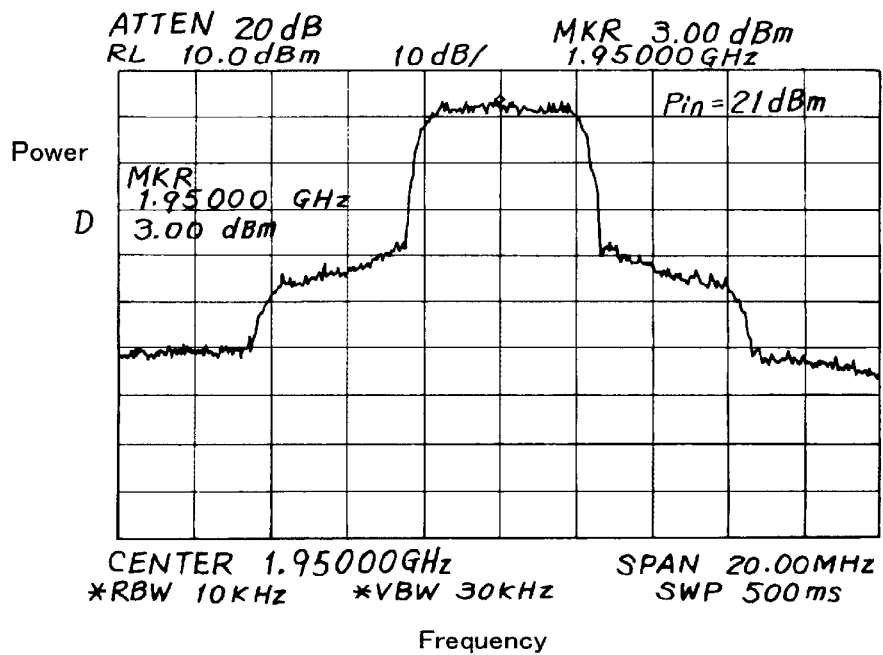
FIG. 8 is a graph showing another output characteristic when a wide-band CDMA signal is transmitted to the superconducting transmission path.

FIG. 8 is a graph showing another output characteristic when a wide-band CDMA signal is transmitted to the superconducting transmission path in FIG. 4. In the example, input power Pin is comparatively high, about 21 dBm. Upon receiving such a high power, the superconducting transmission path can not maintain its superconductivity, and can not retain the linear characteristic shown in FIG. 5. Therefore, according to the output characteristic in FIG. 8, the output power is increased in the bands adjacent to a desired frequency band, and the spectrum is extended.

Figure 9:
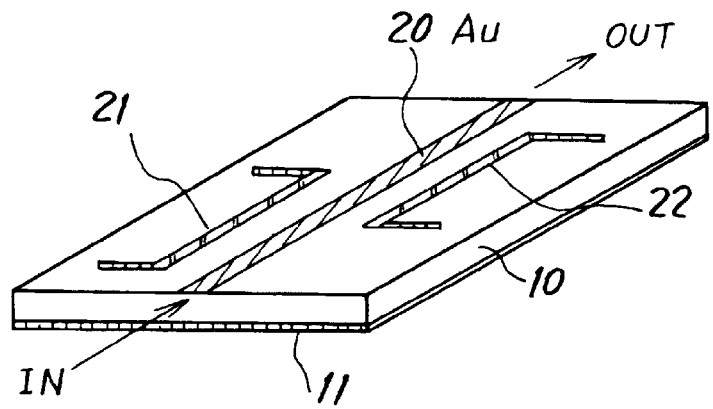
FIG. 9 is a diagram showing the arrangement of a superconducting band rejection filter according to a first embodiment of the present invention.

While taking into the account the power resistance of the superconducting transmission path, in this invention a superconducting band rejection filter is employed to correct the non-linear characteristic of a radio-frequency amplifier. FIG. 9 is a diagram showing an example arrangement for the superconducting band rejection filter according to a first embodiment of the present invention. The superconducting band rejection filter has a micro-strip line structure. A ground conductive layer 11 is deposited on the reverse face of a dielectric substrate 10, and a first conductive line composed of metal (a non-superconducting material), such as gold (Au), and second conductive lines 21 and 22 composed of a superconducting material, such as a high-temperature ceramic, are deposited on the obverse face of the substrate 10.

Each of the second conductive lines 21 and 22 constitutes a micro-strip line resonator which faces the first conductive line 20 at a distance λ/4 of the wavelength λ of a frequency band which is desired to be suppressed for passing through. An input signal IN is supplied at one end of the first conductive line 20, which is made of metal, and an output signal OUT is propagated at the other end.

Example superconducting materials 21, 22 are the following high-temperature superconducting materials made of ceramic.

Y—Ba—Cu—O, Nd—Ba—Cu—O, Bi—Si—Ca—Cu—O(Bi system ceramic)

Bi(Pb)—Sr—Ca—Cu—O (Bi—Pb system ceramic)

Tl—Ba—Ca—Cu—O (Tl system ceramic)

Hg—Ba—Ca—Cu—O (Hg system ceramic)

The following materials are used for the dielectric substrate.

MgO, LaAlO3, sapphire, YSZ

The first line 20 can be formed of a non-superconducting, conductive material other than gold. It should be noted, however, that normally gold is used to reduce the insertion loss to the minimum.

Figure 10:
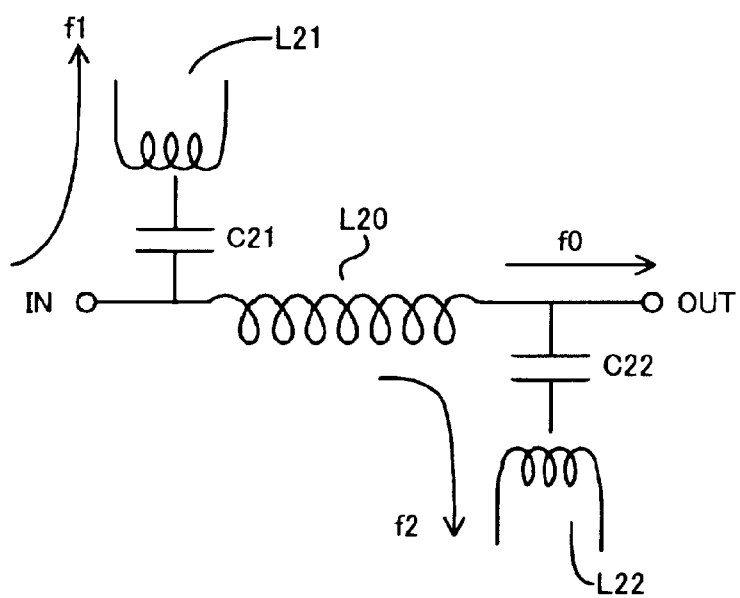
FIG. 10 is a diagram showing an equivalent circuit for the superconducting band rejection filter.

FIG. 10 is a diagram showing an equivalent circuit for the superconducting band rejection filter. The circuit is constituted by an inductance component L20 of the first conductive line 20, inductance components L21 and L22 of the second conductive lines 21 and 22, and capacitors C21 and C22, sited between these inductance components. A signal in a first frequency band f1 resonates with the second conductive line 21 (L21), which constitutes a resonator with the first conductive line 20, and is restricted its passing through the filter. Thereafter, a signal in a second frequency band f2 resonates with the second conductive line 22 (L22), which constitutes a resonator with the first conductive line 20, and is restricted its passing through the filter.

Figure 1B:
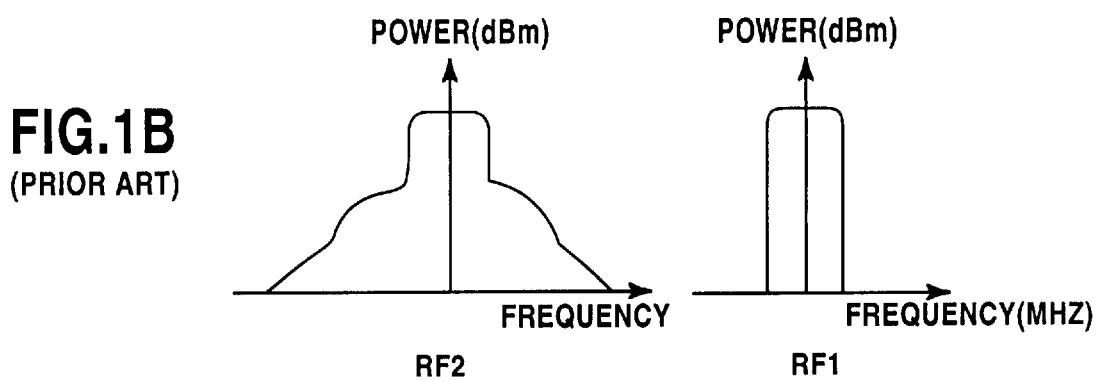
Figure 1C:
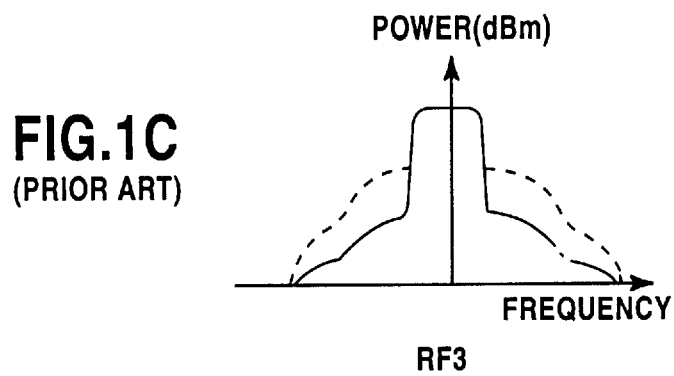

Therefore, as will be described later, when the first and the second frequency bands f1 and f2 are selected as bands which lie adjacent to a desired frequency band f0 for communication, the passing of a signal of the frequency bands f1 and f2 on either side of the communication band to can be suppressed. In addition, as is indicated by the radio-frequency signal RF2 in FIG. 1B, while the power in the communication band f0 is high, the power in the adjacent bands f1 and f2, to which the passing of the signal is limited, is low. That is, if the superconducting band rejection filter in FIGS. 9 and 10 is employed, a signal in a communication band f0, for which the power is high and which should be passed, is transmitted along the first conductive line 20, which is composed of the non-superconducting material, and a signal in an adjacent band f1 or f2, for which the power is low and which should not be passed, is transmitted along the second conductive line 21 or 22, which is composed of the superconducting material. In other words, the band-pass filter can be operated as a superconducting filter only for a signal for which the power is low. Therefore, the transmission of a signal in the communication band f0 is, due to the metal material of the line 20, not affected by the power resistance inherent to the superconducting transmission path, as is shown in FIG. 5. Signals in the adjacent bands f1 and f2 which should be suppressed are used only in a linear, low power area indicated by the input/output characteristic in FIG. 5, and similarly, the power resistance inherent to the superconducting transmission path does not affect the transmission of these signals f1 and f2.

Figure 11:
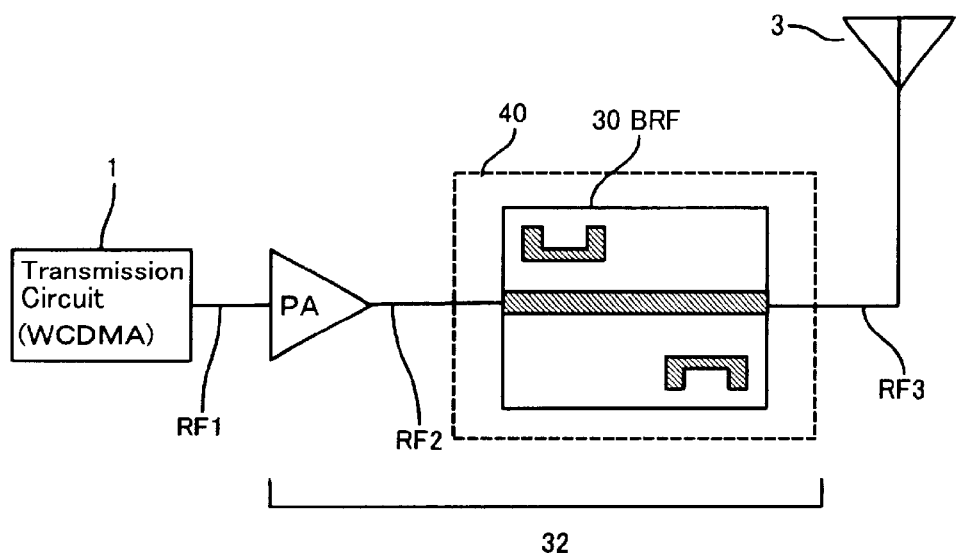
FIG. 11 is a diagram illustrating a radio communication system according to the first embodiment of the present invention.

FIG. 11 is a diagram showing a radio communication system according to this embodiment. For example, a wide-band CDMA transmission circuit 1 generates a radio-frequency signal RF1 having a desired frequency band f0, and supplies it as an input radio-frequency signal to a power amplifier PA. And the power amplifier PA amplifies the input radio-frequency signal, and outputs an output radio-frequency signal RF2. Since the power amplifier PA has a non-linear characteristic for the saturation level related to high input power, the output radio-frequency signal RF2 obtained by the amplification has a spectrum which spreads from the communication band f0 to the adjacent bands f1 and f2.

The radio-frequency signal RF2 which is output is transmitted to a superconducting band rejection filter 30, which is stored in a freezer 40 at a lower temperature than the critical temperature. The superconducting band rejection filter 30 is the one shown in FIG. 9. The power in the bands f1 and f2 on either side of the communication band f0 is suppressed by the superconducting band rejection filter 30, and a radio-frequency signal RF3, for which the power in an adjacent channel is reduced, for example, until it is equal to or lower than 40 dBm, is output. The radio-frequency signal RF3 is transmitted via an antenna 3. In this embodiment, the power amplifier PA and the superconducting band rejection filter 30 constitute a radio-frequency amplifier 32, and the amplified radio-frequency signal RF3, for which the spread of the spectrum is suppressed, is obtained from the input radio-frequency signal RF1.

Figure 12:
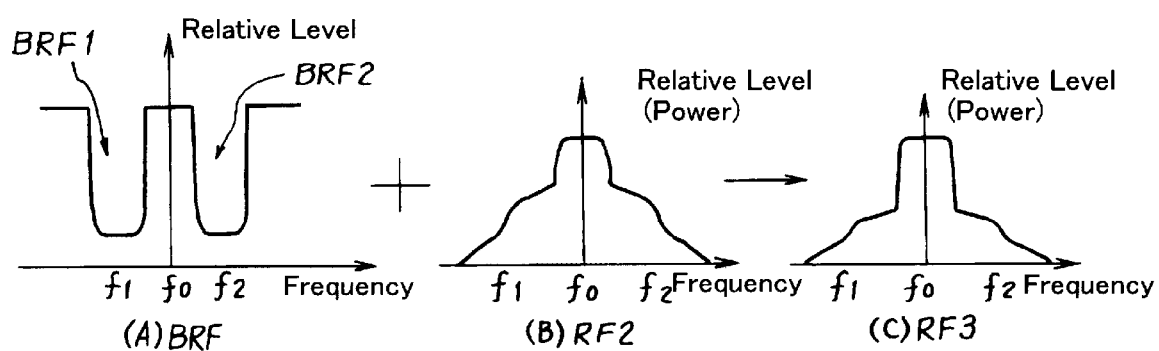
FIGS. 12A to 12C are diagrams for explaining the spectrum of a radio-frequency amplifier.

FIGS. 12A to 12C are diagrams for explaining the spectrum of the radio-frequency amplifier. The frequency property of the superconducting band rejection filter is shown in FIG. 12A. Since the first superconducting micro-strip line 20 is formed of a non-superconducting material, the characteristic of the power loss to a high input power of the communication band f0 is low. Further, since resonators constituted by the superconducting micro-strip lines 21 and 22 are provided for the adjacent frequency bands f1 and f2, the passing of signals in the bands f1 and f2 is suppressed very much. In other words, the superconducting band rejection filter 30 in this embodiment has a lower loss and a sharp skirt characteristic relative to a radio-frequency signal output by the power amplifier PA.

The spectrum of the output signal RF2 of the power amplifier PA is shown in FIG. 12B. When the power amplifier PA is employed at high efficiency, because of the non-linear characteristic for the high power input, a power leak of the output signal RF2 occurs in the channels f1 and f2 adjacent to the communication band f0. The power levels in the adjacent channels f1 and f2 are lower than the power level in the communication band f0. But since the output signal RF2 is passed through the superconducting band rejection filter 30, the leaked power in the adjacent channels f1 and f2 is suppressed and reduced. And as the power level in the adjacent channels f1 and f2 is low, the resonator constituted by the superconducting micro-strip lines 21 and 22 is not affected by the power resistance of the superconducting transmission path. That is, the power of the freqeuncy bands required to operate the superconducting band rejection filter is limited to a range wherein the leaked power is low, so that the problem encountered concerning the power resistance of the conventional superconducting band-pass filter is resolved. As a result, even when the power amplifier PA is operated at high efficiency with its dynamic range extended, the insertion loss at the filter is not increased.

Figure 13:
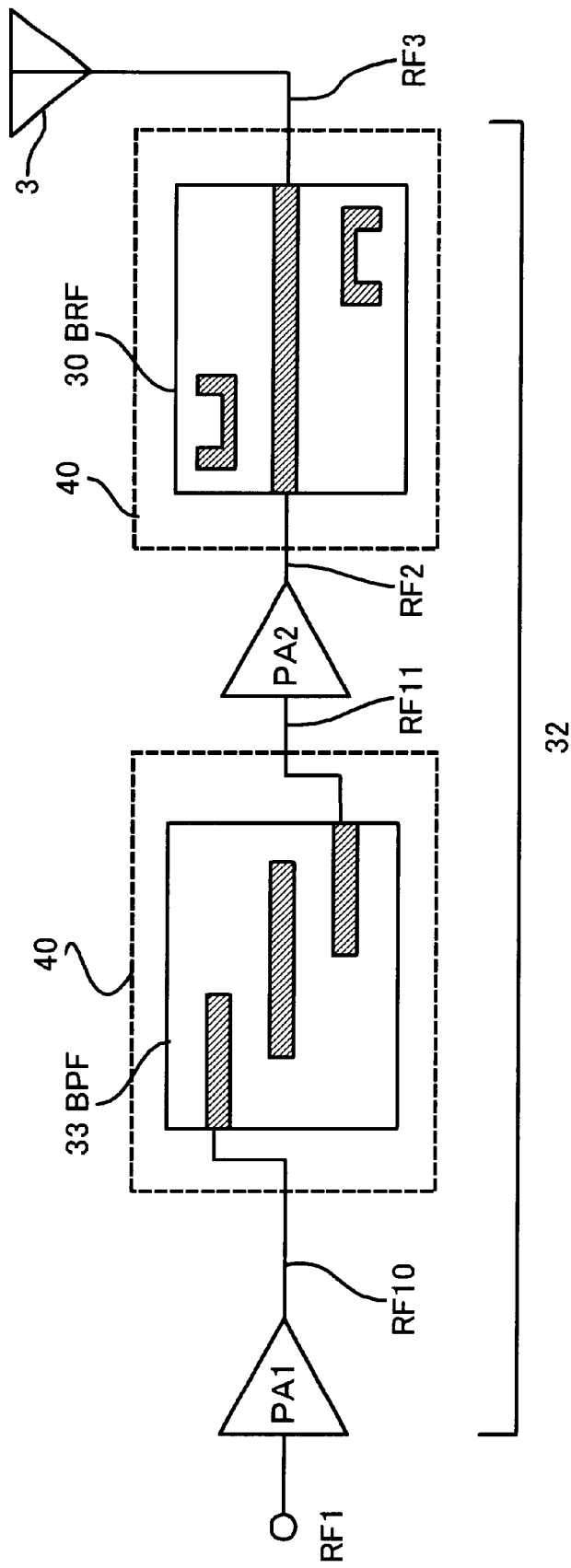
FIG. 13 is a diagram illustrating a radio communication system according to a second embodiment of the present invention.

FIG. 13 is a diagram illustrating a radio communication system according to a second embodiment of the present invention. In this embodiment, to constitute a radio-frequency amplifier 32, a power amplifier PA1 and a superconducting band-pass filter 33 are positioned as a front stage preceding a unit comprising a power amplifier PA2 and the superconducting band rejection filter 30 shown in FIG. 11. The superconducting filters 33 and 30 are stored in freezers 40 and at temperatures lower than the critical temperature.

In this embodiment, the power amplifier PA1 in the front stage amplifies a radio-frequency signal RF1 in a narrow band generated by a transmission circuit (not shown). In this case, the power of an output signal RF10 is so suppressed that the superconductivity of the superconducting band-pass filter 33 is not lost. The power leaked of the output signal RF10 to the adjacent bands is removed by the superconducting band-pass filter 33, and an output signal RF11 is transmitted to the main power amplifier PA2. As a result, the main power amplifier PA2 outputs the amplified radio-frequency signal RF2, for which, in the communication band, the power is very high. Thereafter, in the same manner as in FIG. 11, the power leaked of the adjacent bands is removed by the superconducting band rejection filter 30, and the radio-frequency signal RF3, for which the power in the adjacent bands has been suppressed, is output via an antenna 3.

In the second embodiment, the superconducting bandpass filter 33, composed only of superconducting micro-strip lines, is employed only for a low-power signal input at the front stage, and the superconducting band rejection filter 30 in FIG. 9 is employed for a high-power signal input at the succeeding stage. Therefore, superconductivity is not lost for the high-power signal.

Figure 14:
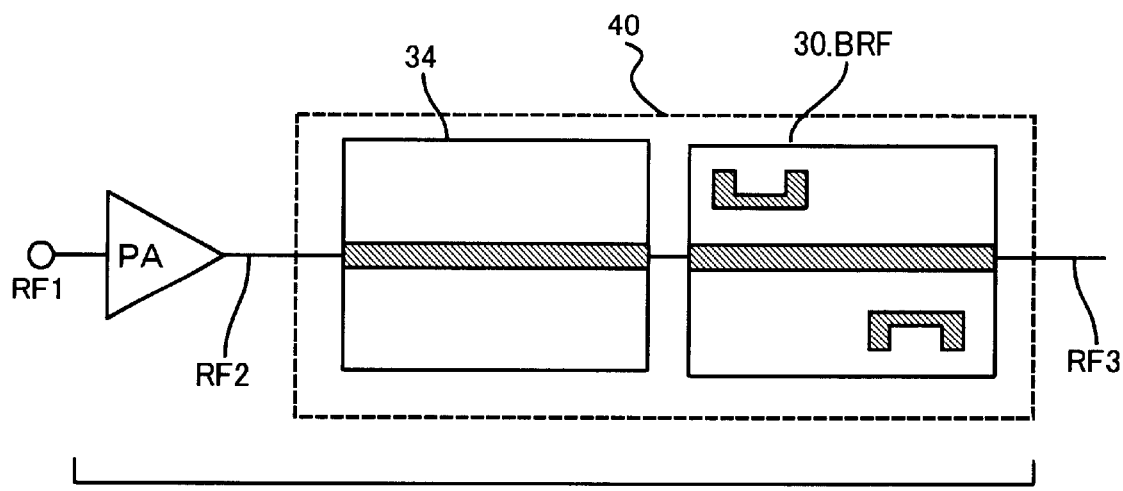
FIG. 14 is a diagram showing a radio-frequency amplifier according to a third embodiment of the present invention.

FIG. 14 is a diagram showing a radio-frequency amplifier according to a third embodiment of the present invention. In this embodiment, a protection circuit 34 formed of a superconducting transmission line is inserted between the power amplifier PA and the superconducting band rejection filter 30 of the radio-frequency amplifier 32 in FIG. 11. The protection circuit 34 is the superconducting transmission line shown in FIG. 4.

As is shown for the input/output characteristic in FIG. 5, when the input power exceeds a predetermined level, the superconductivity of the superconducting transmission line is not maintained and the insertion loss is great. In this embodiment, by using this characteristic, the superconducting transmission line 34 is employed as a protection circuit. If, for example, the power of a radio-frequency signal RF2 is increased due to a specific cause, such as a power line being struck by lightning, the superconducting micro-strip lines 21 and 22 of the superconducting band rejection filter 30 would be destroyed if the protection circuit 34 were not provided. And once the micro-strip lines 21 and 22 were destroyed, the superconducting band rejection filter 30 would have to be replaced, and certain slight adjustments to the radio communication system would have to be made.

When the superconducting transmission line is inserted as the protection circuit 34, a great loss would be experienced only in the event of an unexpectedly high power signal, so that the destruction of the superconducting band rejection filter 30 can be prevented. And if the protection circuit 34 were to be destroyed, only it would have to be replaced, so that the same superconducting band rejection filter 30 could be continuously employed and no adjustment of the system would be required. It should be noted that when the superconducting band rejection filter 30 is connected to the antenna 3, as is shown in FIG. 11, the above protection circuit can be provided between the filter 30 and the antenna 3.

Figure 15:
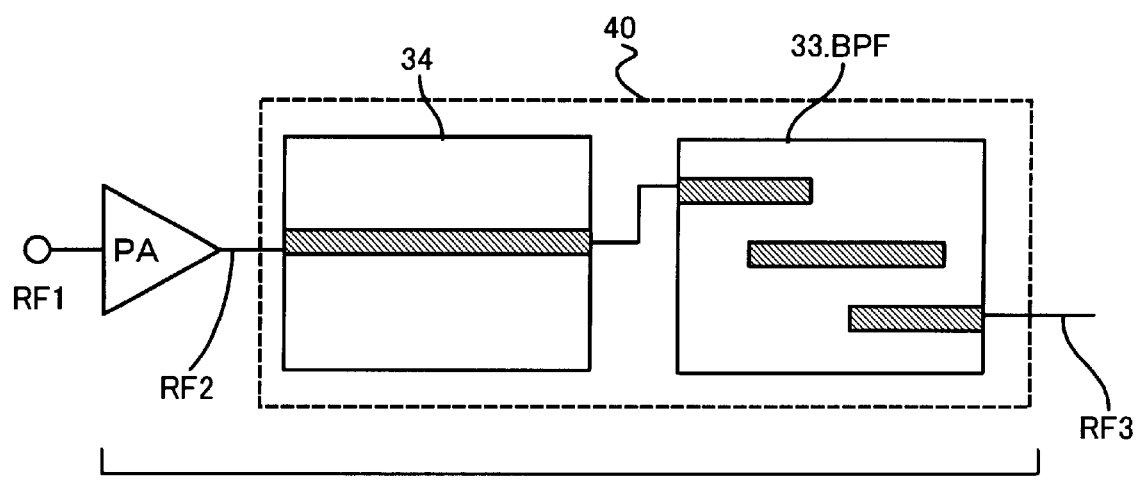
FIG. 15 is a diagram showing a radio-frequency amplifier according to a fourth embodiment of the present invention.

FIG. 15 is a diagram showing a radio-frequency amplifier according to a fourth embodiment of the present invention. In this embodiment, a protection circuit 34 is inserted between a power amplifier PA and a superconducting bandpass filter 33. In this case, the destruction of the superconducting band-pass filter 33 can be prevented when the power of a signal RF2 is unexpectedly high.

Figure 16:
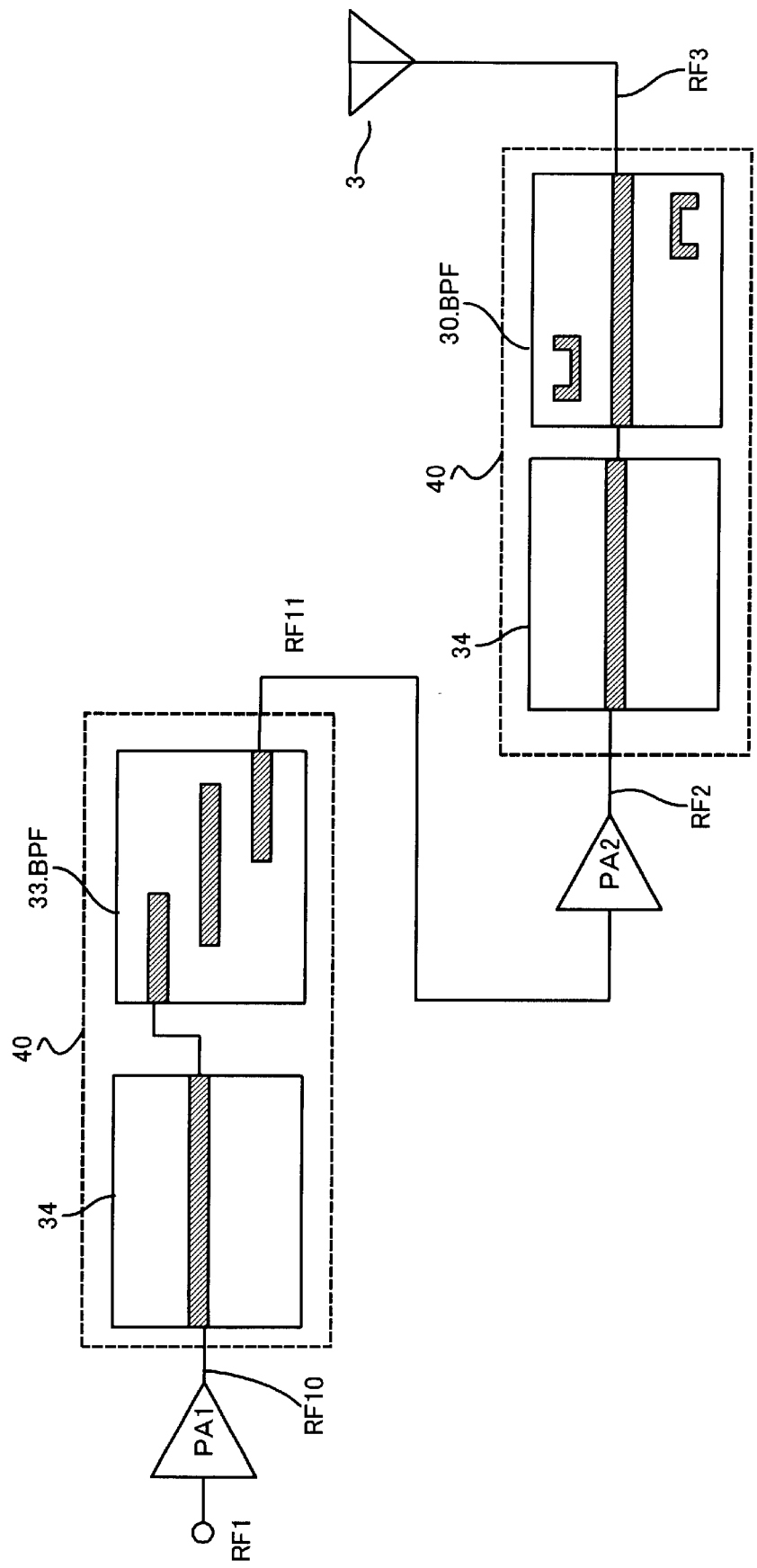
FIG. 16 is a diagram illustrating a radio communication system according to a fifth embodiment of the present invention.

FIG. 16 is a diagram illustrating a radio communication system according to a fifth embodiment of the present invention. In this embodiment, a protection circuit 34 shown in FIG. 14 or 15 is positioned as the front stage of each superconducting filter 33 or 30 in the radio communication system in FIG. 13. The protection circuit 34 is constituted by a superconducting transmission line, and the protection function is the same as that in FIG. 14 or 15. By using the power resistance of the superconducting transmission line, the superconducting filter can be prevented from being destroyed due to a signal for which the power is high.

According to the present invention, since a filter inserted as the succeeding stage for a power amplifier is constructed by superconducting micro-strip lines as a resonator which resonates at a suppressed frequency which is prevented from passing through, and a nonsuperconducting material as a transmission path through which a radio-frequency signal having a higher power passes, thus, power leakage due to the non-linear characteristic of the power amplifier can be effectively suppressed, and the spread of the spectrum of an output signal can be reduced. Further, the destroy of the superconductivity characteristic relative to high power is prevented.

Furthermore, since a protection circuit formed of a superconducting transmission line is inserted as the front stage of a superconducting filter, even if a signal for which the power is unexpectedly high is supplied, a superconducting filter at the succeeding stage can be prevented from being destroyed.

What is claimed is:

1. A radio-frequency amplifier, which amplifies a received radio-frequency signal having a desired frequency band, comprising:

a power amplifier for amplifying the power of said received radio-frequency signal; and a superconducting band rejection filter for receiving a radio-frequency signal from said power amplifier and for suppressing the passing of a signal having frequency bands lying adjacent to said desired frequency band of said radio-frequency signal, said superconducting band rejection filter including
a first line, formed of a non-superconducting material, for receiving said radio-frequency signal, and
a second line, formed of a superconducting material, resonating with said signal in said adjacent frequency bands.

2. The radio-frequency amplifier according to claim 1, wherein said second line of said superconducting band rejection filter includes a high-frequency side line which resonates with a signal in an adjacent frequency band higher than said desired frequency band, and a low-frequency side line which resonates with a signal in an adjacent frequency band lower than said desired frequency band.

3. The radio-frequency amplifier according to claim 1 or 2, wherein said superconducting band rejection filter has a micro-strip line structure, and includes a dielectric substrate on the reverse face of which a ground conductive film is deposited and on the obverse face of which said first and said second lines are formed.

4. The radio-frequency amplifier according to claim 1, further comprising:

a front-stage power amplifier for amplifying said input radio-frequency signal; and a superconducting band-pass filter for receiving an output signal produced by said front-stage power amplifier and for suppressing the passing of a signal of frequency bands adjacent to said desired output signal frequency band, wherein a signal output of said superconducting band-pass filter is transmitted as an input signal to said power amplifier.

5. The radio-frequency amplifier according to claim 1, further comprising a protection circuit having a line composed of a superconducting material inserted between said power amplifier and said superconducting band rejection filter.

6. A radio-frequency amplifier, which amplifies an input radio-frequency signal having a desired frequency band, comprising:

a power amplifier for amplifying the power of said input radio-frequency signal;

a protection circuit, for receiving a radio-frequency signal provided by said power amplifier, which includes a line formed of a superconducting material through which said radio-frequency signal is passed; and a superconducting band-pass filter for receiving a signal output by said protection circuit and for suppressing the passing of a signal of frequency bands adjacent to said desired frequency band.

7. The radio-frequency amplifier according to claim 1, wherein said superconducting band rejection filter is stored in a freezer in which the temperature is maintained lower than the critical temperature of the superconducting material used therefor.

8. A radio communication system comprising:
a radio-frequency amplifier as recited in any one of claims 1, 2, 4, 5, 6, and 7; and
a transmission antenna for transmitting a signal output by said radio-frequency amplifier.

9. The radio-frequency amplifier according to either claim 4 or claim 6, wherein said superconducting band-pass filter is stored in a freezer in which the temperature is maintained lower than the critical temperature of the superconducting material used therefor.

10. The radio-frequency amplifier according to either claim 5 or claim 6, wherein said protection circuit is stored in a freezer in which the temperature is maintained lower than the critical temperature of the superconducting material used therefor.

* * * * *